United States Patent [19]

DeKeersmaecker et al.

[11] E Re. 31,083

[45] Reissued Nov. 16, 1982

[54] NON-VOLATILE MEMORY DEVICES FABRICATED FROM GRADED OR STEPPED ENERGY BAND GAP INSULATOR MIM OR MIS STRUCTURE

[75] Inventors: Roger F. DeKeersmaecker, Herent, Belgium; Donelli J. DiMaria; Donald R. Young, both of Ossining, N.Y.

[73] Assignee: International Business Machines Corporation, Armonk, N.Y.

[21] Appl. No.: 213,537

[22] Filed: Dec. 5, 1980

Related U.S. Patent Documents

Reissue of:

[64] Patent No.: 4,217,601
Issued: Aug. 12, 1980
Appl. No.: 12,279
Filed: Feb. 15, 1979

[51] Int. Cl.[3] ..... H01L 29/34; H01L 29/78

[52] U.S. Cl. ..... 357/54; 357/23; 357/52

[58] Field of Search ..... 357/23, 54, 52

[56] References Cited

U.S. PATENT DOCUMENTS 4,047,974 9/1977 Haran ..... 357/54 X
4,104,675 8/1978 DiMaria ..... 357/54

*Primary Examiner*—Martin H. Edlow
*Attorney, Agent, or Firm*—Hansel L. McGee

[57] ABSTRACT

New non-volatile memory devices fabricated from graded or stepped energy band gap insulator MIM or MIS structures are described. With the graded or stepped insulator, electrons or holes can be injected from the gate electrode at low to moderate applied fields. The carriers flow under the applied field into a wide energy band gap insulator having a prescribed charge trapping layer. This layer captures and stores electrons (write operation) or holes (erase operation) with 100% efficiency.

21 Claims, 10 Drawing Figures

GIMIS $V_g^-$ - ELECTRON INJECTION a-MIS b-SIMIS c-GIMIS a-MIS b-SIMIS c-GIMIS

GIMIS $V_g^-$ - ELECTRON INJECTION

NON-VOLATILE MEMORY DEVICES FABRICATED FROM GRADED OR STEPPED ENERGY BAND GAP INSULATOR MIM OR MIS STRUCTURE

Matter enclosed in heavy brackets [ ] appears in the original patent but forms no part of this reissue specification; matter printed in italics indicates the additions made by reissue.

BACKGROUND OF THE INVENTION

The present invention generally relates to improved semiconductor devices which use a graded band gap structure to promote the injection of holes or electrons at one interface of an insulator, while, simultaneously, electron or hole injection from the opposite interface is blocked and which use a trapping layer to capture holes or electrons with 100% efficiency. More particularly, the present invention, in a preferred embodiment, relates to a graded oxide metal-silicon dioxide-silicon (GOMOS) semiconductor structure which is useful in forming a more efficient memory function.

FET memory devices are known in the art. One such device employs a $MI_1I_2S$ structure wherein $I_1$ and $I_2$ denote first and second insulator layers. The $I_1I_2$ interface may include a metallic impurity which provides a well-defined electron trapping region. The presence or absence of trapped electrons in this region is used to define a memory function either by different values of capacitance of the structure or by monitoring the value of source-drain current as affected by the trapped electron charges in the presence of suitable applied gate voltages. Metallic impurities are not always required at the $I_1I_2$ interface as the same effect can be realized by using two different kinds of insulators. For example, one such known device employs an MNOS structure where a thin oxide film is first formed on a silicon substrate, and over this thin oxide film is laid a much thicker silicon nitride film. In this structure, electrons or holes are trapped in the silicon nitride layer. There is a disadvantage associated with this particular structure, however, and that relates to the thin oxide layer. This oxide layer must be quite thin, on the order of about 20 Å thick, in order to allow tunneling of the electrons or holes from the Si substrate. Reliability problems have been encountered with memory devices with this thin tunnel oxide layer because of the high fields across it during operation.

U.S. Pat. No. 4,104,675 and assigned to a common assignee discloses a device which uses a graded band gap structure to make a charge storage device wherein injection of holes or electrons from one contact is possible without simultaneous injection of electrons or holes from the other contact. The patent shows a structure employing the band gap reduction in an GOMOS FET which performs a memory function. The GOMOS structure employs hole trapping near the Si—$SiO_2$ interface with the structure in an FET configuration. The "write" step involves hole injection from the gate electrode under moderate positive voltage bias and transport to the Si—$SiO_2$ interface where some of the positively-charged holes are trapped in a very stable manner. The "erase" step involves electron injection from the gate electrode under moderate negative voltage bias and transport to the Si—$SiO_2$ interface where the electrons would annihilate trapped holes very readily. The "read" operation uses the conductance of the silicon surface to sense the charge state of the oxide region near the Si—$SiO_2$ interface and uses low gate voltages to prevent further charging of this region.

The band gap graded structure may be fabricated by forming several pyrolytic or CVD $SiO_2$ layers over a relatively thick thermal $SiO_2$ layer with the pyrolytic $SiO_2$ layers having sequentially increasing excess Si content. The structure may also be fabricated by controlled Si ion implantation in the thermal $SiO_2$ layer. The structure can also be fabricated using plasma deposited layers of $SiO_2$ graded with Si. Other insulating layers which given enhanced carrier injection from the gate electrode due to actual band gap reduction or effective band gap reduction (for instance, by trap assisted tunneling) are also possible.

The devices having the structure shown in U.S. Pat. No. 4,104,675 have the disadvantages of having the charge trapping region being process dependent, suffer from surface state build-up at the Si—$SiO_2$ interface due to the passage of holes, are sensitive to "hot" carrier injection from the Si substrate due to the presence of the trapped holes, and require hole injection and trapping to be the first operation since these traps do not capture electrons without the presence of the holes first.

SUMMARY OF THE INVENTION

The present invention uses an improved graded band gap structure to make a charge storage device wherein injection of holes or electrons from one contact is possible without compensating injection of electrons or holes from the other contact. The improvement is the inclusion of a charge trapping layer in the thick insulator region adjacent to the silicon semiconducting body. The trapping layer is situated at a distance of approximately 50 Å or more from the Si-insulator interface to prevent trapped carriers from tunneling from this layer to the Si substrate.

This trapping layer captures and stores either electrons (write operation) or holes (erase operation) with as close to 100% efficiency as possible, unlike the prior art device of U.S. Pat. No. 4,104,675 which is capable of trapping holes only. Electrons will annihilate these trapped holes, but they are not captured when the hole traps are empty and in a neutral charge state. In the present invention, the write and erase operations can be interchanged if holes are injected first to write and the electrons are used to erase.

The band gap structure may be fabricated by the method disclosed in the above-mentioned U.S. Pat. No. 4,104,675 and is incorporated by example herein. The structure is fabricated by forming several pyrolytic or CVD $SiO_2$ layers over a relatively thick thermal $SiO_2$ with the pyrolytic $SiO_2$ layers having sequentially increasing excess Si content. The trapping layer may be formed by controlled impurity ion-implantation, by diffusion of the impurity into the relatively thick thermal $SiO_2$ layer, or by deposition of the impurity on thermal $SiO_2$ with stoichiometric CVD $SiO_2$ isolating it from the injector region consisting of the Si rich CVD $SiO_2$ layers.

DESCRIPTION OF THE PREFERRED EMBODIMENT

Figure 1A:
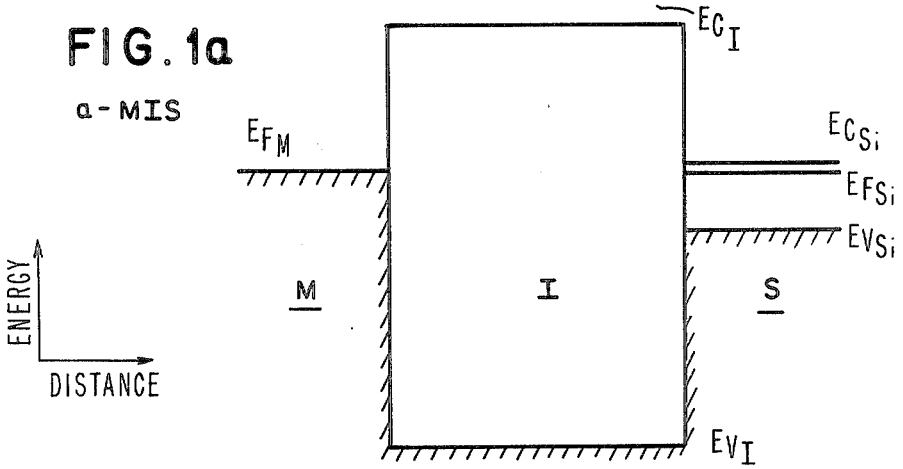
FIGS. 1(a–c) are zero field energy band diagrams for prior art MIS structures, stepped insulator MIS (SI-MIS) structures, and graded insulator MIS (GIMIS) structures, respectively.

A novel type of semiconductor device which can be used for electrically-alterable-read-only-memory (EAROM) is described. This device is formed by stepping or grading the energy band gap near the metal gate electrode of a metal-insulator-semiconductor (MIS) structure as shown in FIG. 1a.

Figure 1B:
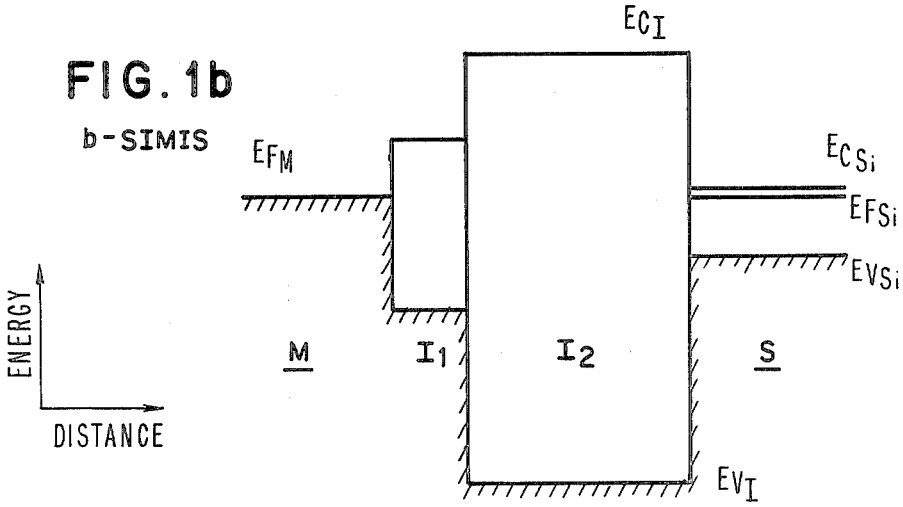
Figure 1C:
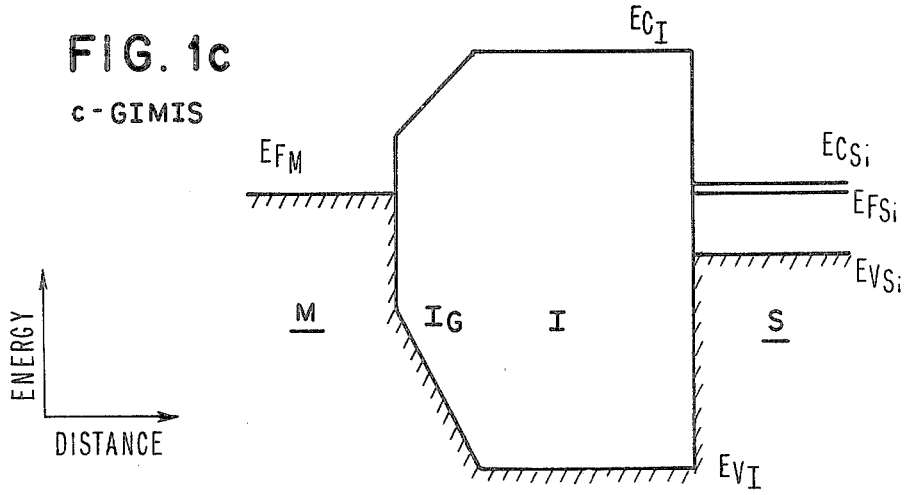

FIGS. 1b and 1c are illustrative of the structures of the present invention. With these types of structures electrons or holes can be injected from the gate electrode more easily into the insulating layer with less applied voltage. The stepped or graded regions in this drawing are kept thin compared to the thermal oxide region to minimize the effects of trapped space charge in the graded or stepped regions on the electric fields at the interfaces which control carrier injection and charge sensing.

Figure 2A:
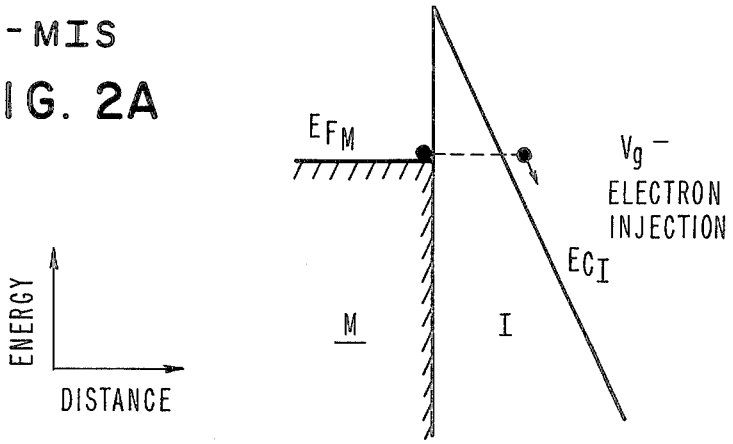
FIGS. 2(a–c) are energy band diagrams for negative gate bias electron injection from the gate electrodes for the structures represented by FIG. 1.
Figure 2B:
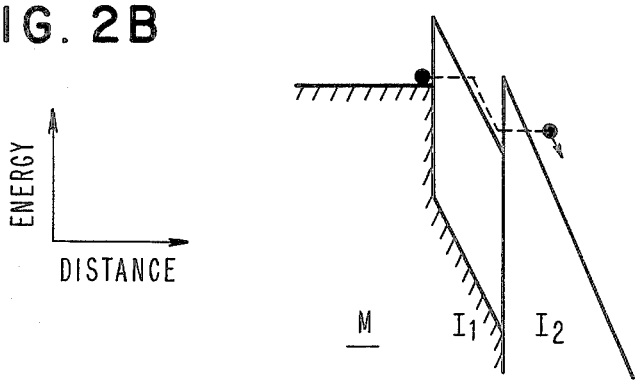
Figure 2C:
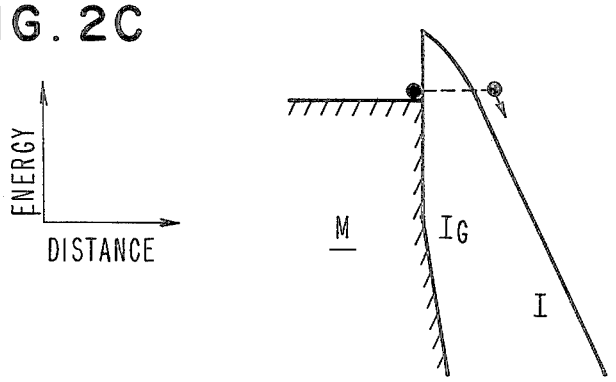

FIG. 2 is illustrative of the ease of injection. It shows the effect of negative gate voltage bias (electron injection) where the average electric field in the bulk of the wide band gap insulator is the same for FIGS. 2a, b and c. Clearly, the GIMIS FIG. 2c structure is a better injector than the MIS (FIG. 2a) or SIMIS (FIG. 2b) due to the smaller energy barrier at this interface and therefore shorter tunneling distance. The band distortion in the stepped or graded region is typical for realistic materials which all have high dielectric constants than $SiO_2$.

Electron or hole injection from the semiconductor substrate will not simultaneously occur due to the larger energy band gap (see FIG. 1) that those carriers "see" for the same average electric fields that produce injection (via tunneling) from the top gate contact.

Figure 3:
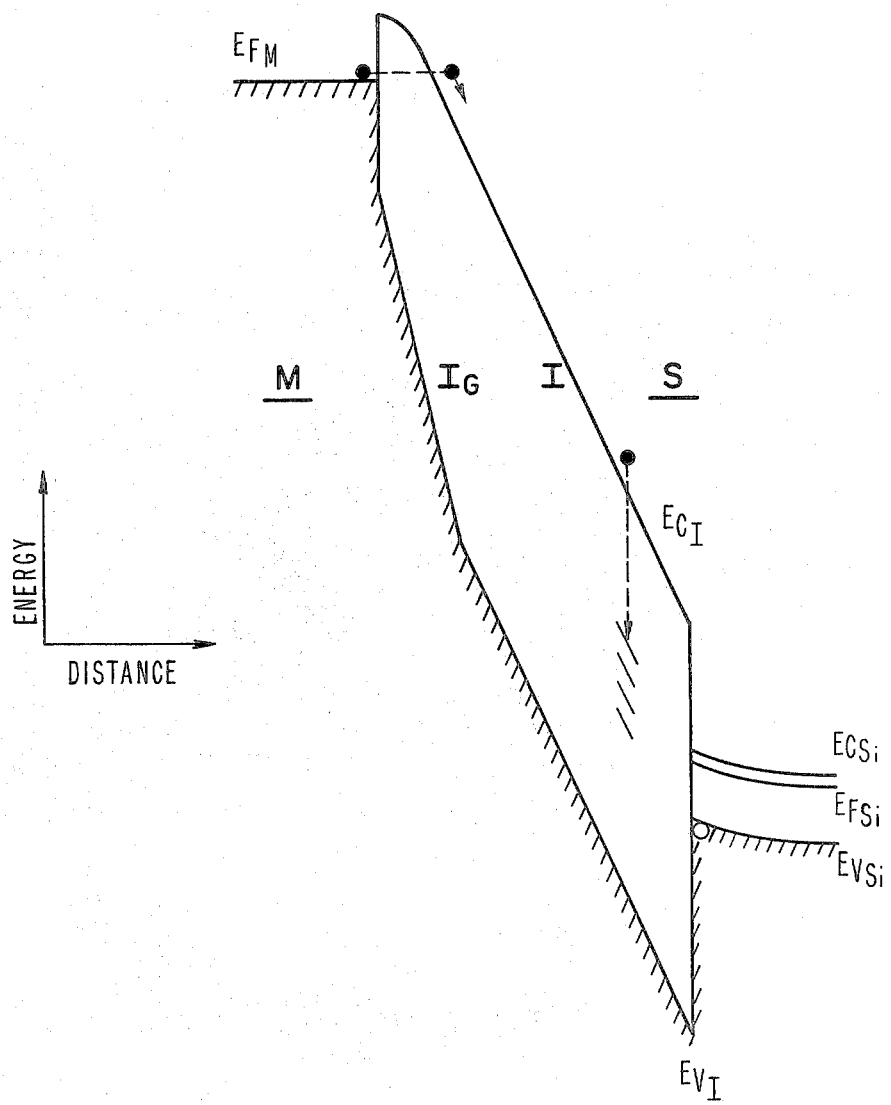
FIG. 3 is an energy band diagram for negative gate bias for a GIMIS structure showing electron injection and subsequent capture in a purposely introduced charge trapping layer in the wide band gap insulator near the insulator-silicon interface.

Using the graded or stepped energy band gap insulator-MIS system, a non-volatile semiconductor structure can be fabricated which uses the substrate Si-insulator interface strictly for sensing storage charge ("read" operation) in a purposely introduced charge trapping layer in the wide energy band gap insulator (as shown in FIG. 3). Ion implanted As and P, deposited W less than a monolayer thick, and deposited polycrystalline silicon can be used for this trapping layer which will capture either injected electrons or holes. The "write" ("erase") operation is achieved by electron (hole) injection or vice versa at low to moderate average electric fields (2–5 MV/cm are typical) from the gate electrode for negative (positive) voltage bias, and the subsequent capture of preferably all injected electrons (holes) in the trapping region. This separation of sensing and charging operations makes this structure unique compared to other types of non-volatile memory structures, or their variations, such as floating-gate-avalanche-injection-metal-silicon dioxide-semiconductor (FAMOS) or metal-silicon nitride-silicon dioxide-semiconductor (MNOS) structures. GIMIS and SIMIS devices also potentially have other advantages over these EAROM structures. Some of these are the following:

1. Low voltage is required. Local fields at the substate Si-insulator interface are low, interface state generation should be minimized, and this interface should not deteriorate. MNOS structures are believed to deteriorate with cycling due to high electric fields at the Si-tunnel $SiO_2$ interface. Low power is also required for the GIMIS or SIMIS structures since large Si currents are not required as in EAROMs which use avalanche injection from the Si to charge traps such as FAMOS structures.

2. Interface state generation or trapped charge buildup at the Si—$SiO_2$ interface due to "hot" carrier injection from the Si substrate will not occur. FAMOS structures or their variations have these problems which limit the number of cycles they can be put through.

3. GIMIS or SIMIS structures can be electrically "erased" in place in short times with the same type of charge retention as FAMOS devices. FAMOS-like structures are difficult to erase and require ultra-violet light and long times (minutes to hours) to photodetrap electrons on the floating gate embedded in the $SiO_2$ layer.

In one embodiment of the invention a structure is fabricated to demonstrate GIMIS or SIMIS type operation. The structure fabricated is a variation of an MNOS device. However, unlike the MNOS structures which have a thick $Si_3N_4$ trapping layer to store charge and a thin tunnel oxide of $\approx$20–30 Å thickness grown on the Si substrate, the SIMIS devices have thick oxide and thin nitride layers. The thin $Si_3N_4$ (5.2 eV band gap, 7.5 low frequency dielectric constant) is used as the electron or hole injecting layer and not a charge storage layer as in a standard MNOS structure. The energy band diagram for the type of SIMIS structure is similar to that shown in FIGS. 1b and 2b. The thermal $SiO_2$ layers (9 eV band gap, 3.9 low frequency dielectric constant) in these SIMIS structures were grown on $<100>$ 2 Ω cm p-type Si substrates at 1000° C. in $O_2$ to thicknesses between 400–1300 Å. The $Si_3N_4$ layers are chemically vapor deposited (CVD) to thicknesses between 25–600 Å at 810° C. with a $NH_3/SiH_4$ ratio of 150/1 on top of the $SiO_2$ layer.

The charge trapping region is formed in the thick $SiO_2$ layer by using ion implanted As prior to the $Si_3N_4$ deposition. After implantation a 1000° C. anneal in $N_2$ for 30 min. is performed to remove radiation damage followed by a 500° C. forming gas anneal for 30 min. to reduce surface states at the Si-$SiO_2$ interface. Then the $SiO_2$ surface is cleaned of metals and hydrocarbons. Finally, an Al metal gate electrode is deposited on top of the $Si_3N_4$ layer.

Figure 4:
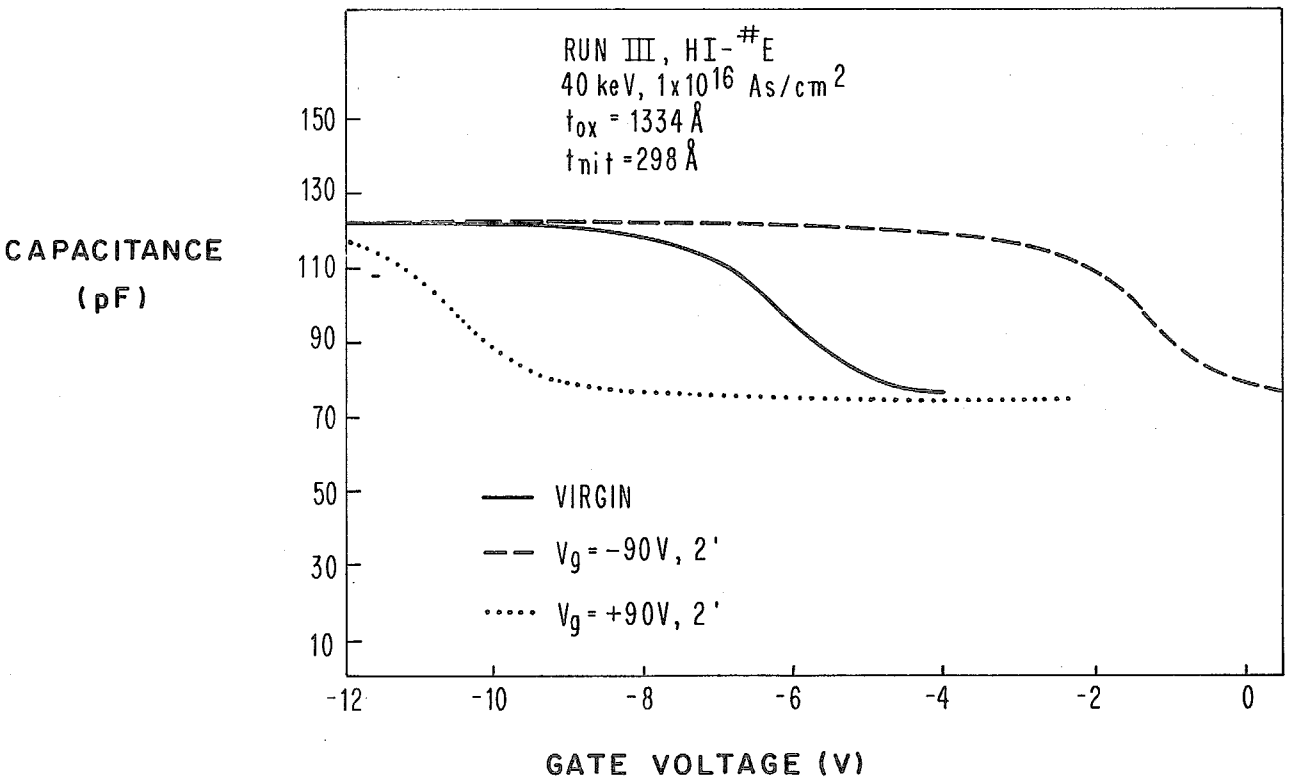
FIG. 4 is a diagram depicting the high frequency capacitance as a function of the gate voltage for a SIMIS structure (a) an as fabricated virgin SIMIS, (b) after electron injection and trapping, and (c) after hole injection and trapping.

FIG. 4 shows the "write" and "erase" operation of one of these SIMIS structures. This structure was formed from a 1334 Å $SiO_2$ layer and a 298 Å $Si_3N_4$ layer. An As implant at a fluence of $1\times10^{16}$ ions/cm$^2$ at an energy of 40 keV was used to form the trapping region for electrons and holes. This heavy fluence was used to insure 100% trapping of injected carriers. Lighter fluences, which were also studied, were not as effective. Negative (positive) gate voltages, producing a moderate average field in the $SiO_2$, were used to inject electrons (holes) which were trapped on As-related sites. This moved the high frequency (1 MHz) capacitance-voltage curves to more positive (negative) voltages due to the change in the internal electric fields as sensed by the Si substrate. Without the trapping region, no significant charge storage effects were seen under the conditions listed in FIG. 4. The $Si_3N_4$ layer was kept as thin as possible relative to the oxide layer to minimize trapped space charge effects in this layer which would limit injection efficiencies.

Scaled down structures similar to that in FIG. 4 with an oxide thickness of 550 Å and a nitride thickness of 50 Å were also fabricated. The trapping layer for these was formed using a 10 keV implant to prevent n-type doping of the p-type Si substrate with As. Thinner oxide layers were not possible due to this doping effect, and lower energy implants at fluences of $1\times10^{16}$ ions/cm$^2$ were also difficult due to the implantation times involved. Other structures with oxide and nitride thicknesses and ion energies between this and those in FIG. 4 were also fabricated. All structures behaved in a fashion similar to that in FIG. 4 for comparable conditions with applied voltage requirements decreasing with insulator thickness.

Figure 5:
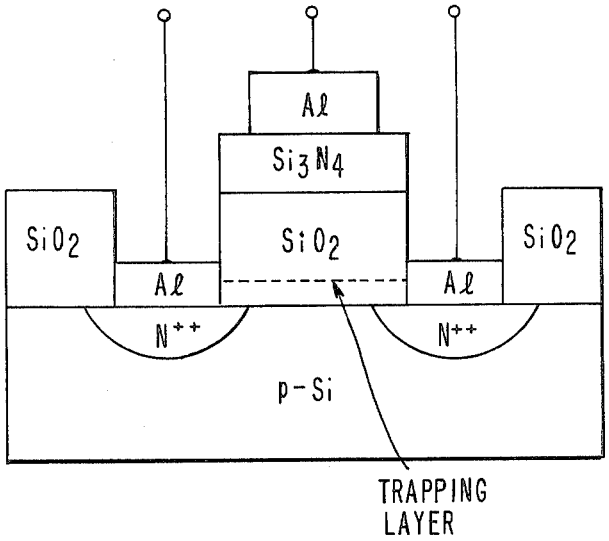
FIG. 5 is a cross-sectional view of a SIMIS FET structure according to the invention.

The SIMIS structures described (see FIG. 5) here having ion implanted oxide layers and an injecting layer of smaller energy band gap $Si_3N_4$ can be cycled reproducibly between the "written" and "erased" states after the first few cycles. Once written, "read perturb" effects at room temperature were fairly low with only a small percentage of trapped electrons being lost or compensated at the low average fields required for actual read operations in a field effect transistor (FET) structure.

Some preliminary FET structures were fabricated using a floating polycrystalline Si charge storage layer, on thermal $SiO_2$ with thin CVD $SiO_2$ and $Si_3N_4$ layers between it and a top gate electrode also of poly-Si. These structures switched as would be expected for SIMIS operation at voltages as low as 15 V with minimal "read perturb" at voltages $<6$ V.

It should be noted that in these floating gate type structures there may be injection regions, separate and apart from the gate region.

As seen in FIG. 2, a GIMIS structure is a more efficient carrier injector than a SIMIS structure. A graded band gap is pictured as a stepped band gap with an infinite number of steps.

Another type of injector using a CVD or plasma deposited $SiO_2$ layer with increasing Si content and therefore decreasing energy band gap and resistivity can also be fabricated. CVD structures were shown to be extremely efficient electron injectors and fairly good hole injectors. In these structures, $\gtrsim 10^6$ times the electron current and $\approx 10^2$ times the hole current were observed for the same average thermal $SiO_2$ electric fields as compared to structures without the Si rich CVD $SiO_2$ injecting layer.

Other materials to grade the $SiO_2$ layer to a metal or poly-Si gate electrode contact with low frequency dielectric constants equal to or less than that of thermal $SiO_2$ which has a value of 3.9 are desirable.

The best possible GIMIS structure would require complete grading of $SiO_2$ to a top gate electrode of polycrystalline Si. This can be accomplished using low temperature plasma deposition techniques as opposed to CVD deposition techniques in which only 10% Si at most can be incorporated into the $SiO_2$ film.

Figure 6:
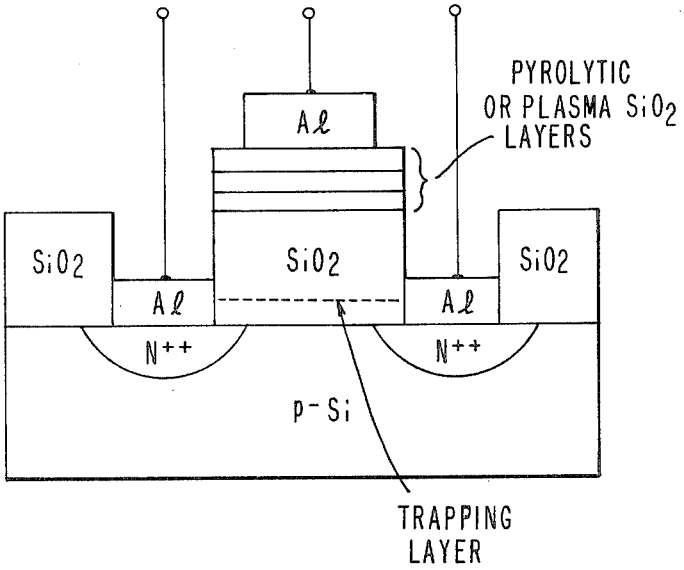
FIG. 6 is a cross-sectional view of a GIMIS FET structure according to the invention.

GIMIS devices can be fabricated according to the method disclosed in U.S. Pat. No. 4,104,675 commonly assigned, which method is herein incorporated. Typically the fabrication is as follows:

Starting with a single crystal silicon substrate, a relatively thick thermal $SiO_2$ insulator layer is grown. Over this thermal oxide insulator layer are deposited successive pyrolytic or chemical vapor deposition (CVD) $SiO_2$ layers. In FIG. 6, three such layers are shown, but any number of layers may be used. Each pyrolytic oxide layer is relatively thin compared to the overall thermal oxide insulator layer; and each successive pyrolytic oxide layer has an increasing amount of excess silicon. It is known that pyrolytic oxide layers can be formed with excess silicon as described, for example, in U.S. Pat. No. 3,649,884. The number of pyrolytic layers, the thickness of each layer, and the amount of excess silicon in each successive layer is a matter of design choice.

The thick oxide layer is ion implanted to form a trapping layer as descibed above for the SIMIS type structure. A trapping layer can also be formed by diffusing or depositing an impurity such as W prior to CVD $SiO_2$ deposition. This impurity would be isolated from the graded injector region with a stoichiometric CVD $SiO_2$ layer.

While the invention has been described in terms of preferred embodiments, those skilled in the art will understand that various modifications can be made in the practice of the invention without departing from the scope of the appended claims. For example, although the preferred embodiment of the invention has been described in terms of MNOS and MOS structures, the teachings of the invention are equally applicable to metal-insulator-metal (MIM) or MIS structures. Moreover, while the gate structure of the preferred embodiment has been described as comprising an aluminum contact, those skilled in the art will recognize that other metals or semiconductors could be used. Specifically, polycrystalline silicon could be deposited over the pyrolytic oxide layers to form the gate electrode contact.

Having thus described our invention, what we claim as new, and desire to secure by Letters Patent is:

1. A metal-insulator-metal or metal-insulator-semiconductor structure, wherein the band gap of the insulator layer at its first interface only is reduced to provide an injection region where holes or electrons depending on voltage bias, can be injected into the insulator under low to moderate electrical field conditions from the contact at this interface while, simuitaneously, electron or hole injection from said insulator's second interface is blocked due to the large insulator band gap near said second interface, the improvement being a charge trapping layer embedded in said insulator near its second interface for capturing and storing injected electrons or holes with high efficiency.

2. The device of claim 1 comprising a silicon substrate having thereon a relatively thick insulator having embedded therein a layer of impurity atoms proximate to said insulator's second interface at said substrate and said thick insulator having a decreasing band gap in the vicinity of its first interface, said decreasing band gap being produced by ion implantation.

3. The device of claim 1 comprising a silicon substrate having a first relatively thick oxide insulator thereon said insulator having embedded therein a layer of impurity atoms proximate to its interface with said substrate and over which is deposited a relatively thin layer of $Si_3N_4$ and a metal or semiconductor contact on the deposited $Si_3N_4$ layer.

4. The device of claim 1 comprising a silicon substrate having a first relatively thick oxide insulator thereon said insulator having embedded therein a layer of impurity atoms proximate to said its interface with said substrate, and over which is deposited a plurality of relatively thin pyrolytic or plasma oxide layers, each successively deposited pyrolytic or plasma oxide layer containing an increasing excess silicon content, and a metal or semiconductor contact on the last pyrolytic or plasma deposited oxide layer.

5. A stepped insulator metal-silicon dioxide-silicon SIMOS FET structure having an injection region adjacent to the gate electrode, said injection region comprising a thin stepped band gap insulator adjacent to a relatively thick silicon dioxide insulator layer having embedded therein a layer of impurity atoms.

6. A stepped insulator metal-silicon dioxide-silicon SIMOS FET structure of claim 5 wherein the gate structure comprises a relatively thick oxide on a silicon substrate and a relatively thin layer of $Si_3N_4$ formed over the oxide.

7. An improved graded oxide metal-silicon dioxide silicon GIMOS FET structure having an injection region adjacent to the gate electrode, said injection region comprising a thin graded band gap, said improvement being a layer of impurity atoms embedded in an oxide layer adjacent to the silicon substrate.

8. An improved GIMOS FET structure as in claim 7 wherein the structure comprises a relatively thick oxide on a silicon substrate, having embedded in said oxide a layer of impurity atoms and a plurality of relatively thin pyrolytic or plasma deposited oxide layers formed over the oxide, each successive pyrolytic or plasma deposited oxide layer containing an increasing excess silicon content.

9. In a MOS FET device for performing a memory function said device being of the type comprising a silicon substrate having source and drain regions formed therein and an insulated gate structure formed between said source and drain regions, and wherein the band gap of the insulator of the insulated gate structure is reduced near the gate electrical contact interface to provide an injection region wherein holes or electrons depending on voltage bias, can be injected into the insulator under low to moderate electric field conditions from the gate electrical contact while simultaneously, electron or hole injection from the substrate interface is blocked due to the large insulator band gap at this interface, the improvement being a layer of impurity atoms embedded in said gate oxide proximate to the oxide-silicon interface for capturing and storing injected electrons or holes with high efficiency.

10. The MOS FET device of claim 9 wherein the insulator comprises an oxide having a thin layer of $Si_3N_4$ deposited thereon to provide a low band gap insulator in the vicinity of the gate electrical contact interface.

11. The MOS FET device of claim 9 wherein the insulator comprises an oxide having a decreasing band gap in the vicinity of the gate electrical contact interface, said decreasing band gap being produced by ion implantation.

12. The MOSFET device of claim 9 wherein the insulator comprises a first relatively thick oxide layer over which is deposited a plurality of relatively thin pyrolytic or plasma oxide layers, each successively deposited pyrolytic or plasma oxide layers containing an increasing silicon content.

13. A metal-insulator-metal or metal-insulator-semiconductor structure, wherein the band gap of the insulator layer at its first interface only is reduced to provide an injection region where holes or electrons depending on voltage bias, can be injected into the insulator under low to moderate electrical field conditions from the contact at this interface while, simultaneously, electron or hole injection from said insulator's second interface is blocked due to the large insulator band gap near said second interface, the improvement being a floating polycrystalline silicon charge storage layer in said insulator near its second interface for capturing and storing injected electrons or holes with high efficiency.

14. The metal-insulator-metal or metal-insulator-semiconductor structure of claim 13 wherein said injection regions is separate and apart from said gate region.

15. A stepped insulator metal-silicon dioxide-silicon SIMOS FET structure having an injection region adjacent to the gate electrode, said injection region comprising a thin stepped band gap insulator, adjacent to a relatively thick silicon dioxide insulator layer having a floating polycrystalline silicon charge storage layer therein.

16. A stepped insulator metal-silicon dioxide-silicon SIMOS FET structure of claim 15 wherein said injection regions are separate from said gate region.

17. An improved graded oxide metal-silicon dioxide silicon GIMOS FET structure having an injection region adjacent to the gate electrode, said injection region comprising a thin graded band gap insulator, said improvement being a floating polycrystalline silicon charge storage layer in an oxide layer adjacent to the silicon substrate.

*18. A metal-insulator-metal or metal-insulator-semiconductor structure, wherein the insulator has disposed thereon at its first interface, at least one relatively thin successive oxide layer, each successive oxide layer containing an increasing silicon content which provides an injection region where holes or electrons depending on voltage bias, can be injected into the insulator under low to moderate electrical field conditions from the contact at this first interface, while, simultaneously electron or hole injection from said insulator's second interface is blocked, the improvement being a charge trapping layer embedded in said insulator near its second interface for capturing and storing injected electrons or holes with high efficiency.*

*19. A metal-insulator-metal or metal-insulator-semiconductor structure according to claim 18 wherein said charge trapping layer is replaced by a floating polycrystalline silicon charge storage layer.*

*20. In a MOSFET device for performing a memory function said device being of the type comprising a silicon substrate having source and drain regions formed therein and an insulated gate structure formed between said source and drain regions and wherein said insulator comprises a relatively thick oxide layer over which is deposited at least one relatively thin successive oxide layer, each successively deposited oxide layer containing an increasing silicon content to provide an injection region wherein holes or electrons depending on voltage bias, can be injected into the insulator under low to moderate electric field conditions from the gate electrical contact which simultaneously, electron or hole injection from the substrate interface is blocked, the improvement being a layer of impurity atoms embedded in said oxide proximate to the oxide-silicon interface for capturing and storing injected electrons or holes with high efficiency.*

*21. A MOSFET device according to claim 20 wherein said layer of impurity atoms is replaced by a floating polycrystalline silicon charge storage layer.*

* * * * *